(12) United States Patent
Wu et al.

(10) Patent No.: US 10,520,528 B2
(45) Date of Patent: Dec. 31, 2019

(54) DEW RESISTANT MODULE FOR TEST SOCKET AND ELECTRONIC COMPONENT TESTING DEVICE HAVING THE SAME

(71) Applicant: Chroma Ate Inc., Taoyaun (TW)

(72) Inventors: Xin-Yi Wu, Taoyuan (TW);
Chien-Hung Lo, Taoyuan (TW);
Jui-Chih Chou, Taoyuan (TW);
Hao-Che Yang, Taoyuan (TW); Nan-Yi Kuo, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 184 days.

(21) Appl. No.: 15/790,185

(22) Filed: Oct. 23, 2017

(65) Prior Publication Data

US 2018/0113151 A1 Apr. 26, 2018

(30) Foreign Application Priority Data

Oct. 25, 2016 (TW) .............................. 105134410 A

(51) Int. Cl.
*G01R 31/26* (2014.01)
*G01R 1/04* (2006.01)
*G01R 31/28* (2006.01)

(52) U.S. Cl.
CPC ....... *G01R 1/0458* (2013.01); *G01R 31/2831* (2013.01); *G01R 31/2877* (2013.01); *G01R 31/2881* (2013.01)

(58) Field of Classification Search
CPC ............ G01R 31/2831; G01R 31/2881; G01R 31/2887; G01R 31/2867; G01R 31/2874; G01R 31/2893; G01R 1/04; G01R 1/0458; G01R 1/0408; G01R 1/44; H01L 23/427; H01L 23/437; H01L 23/3731
See application file for complete search history.

(56) References Cited

U.S. PATENT DOCUMENTS

| 6,993,922 | B2 | 2/2006 | Wall et al. |
| 7,479,795 | B2* | 1/2009 | Hayashi ............ G01R 31/2874 324/750.09 |
| 9,353,995 | B2 | 5/2016 | Wu et al. |
| 9,989,557 | B2* | 6/2018 | Howell ................ G01R 1/0408 |
| 2004/0077200 | A1* | 4/2004 | Ishikawa ................ G01R 31/01 439/190 |

(Continued)

FOREIGN PATENT DOCUMENTS

| JP | H05121598 A | 5/1998 |
| TW | 201140088 A1 | 11/2011 |

(Continued)

*Primary Examiner* — Minh N Tang
(74) *Attorney, Agent, or Firm* — McClure, Qualey & Rodack, LLP

(57) ABSTRACT

A dew resistant module for a test socket, and an electronic component testing device having the same are provided. An enclosure body is provided to circumscribe the test socket; and a test socket base plate provided on top of the test socket and enclosure body. A cover is provided to cover the test socket, enclosure body and test socket base plate. With the provision of the enclosure body and the cover, the test socket, test socket base plate and a portion of the thermal head are prevented from coming into contact directly with the atmosphere, whereby condensation or dewing is prevented, thermal insulation achieved and energy consumption minimized.

9 Claims, 3 Drawing Sheets

(56) References Cited

U.S. PATENT DOCUMENTS

2004/0139756 A1    7/2004   Wall et al.
2014/0368999 A1   12/2014   Wu et al.

FOREIGN PATENT DOCUMENTS

TW    201238453  A1   9/2012
TW      1384237  B1   2/2013
TW    201500746  A    1/2015

* cited by examiner

DEW RESISTANT MODULE FOR TEST SOCKET AND ELECTRONIC COMPONENT TESTING DEVICE HAVING THE SAME

CROSS-REFERENCE TO RELATED APPLICATION

The present application claims priority to Taiwan patent application No. 105134410, filed Oct. 25, 2016, the contents of which are incorporated herein by reference.

BACKGROUND OF THE INVENTION

1. Field of the Invention

The present invention relates to a dew resistant module for a test socket, and an electronic component testing device having the same, and particularly to dew resistant module for a test socket, and an electronic component testing device having the same suitable for testing the electronic components under high or low-temperature environments.

2. Description of the Related Art

With the requirements for the weatherability of the semiconductor wafers, more and more semiconductor chip manufacturers demand for high-temperature or low-temperature testing of the chips manufactured to ensure that the chips can be normally operated under predetermined high or low-temperature environments.

The concept underlying high and low-temperature testing of the semiconductor chip is to heat or cool the chip. A testing method of the known type is the burn-in test as disclosed in, for example, Taiwan Pat. No.: 1384237, in which the test device along with the semiconductor chip to be tested is placed in a test chamber which provides the high-temperature or low-temperature environments. Further, for example, U.S. Pat. Pub. No.: 2004139756 discloses heating or cooling the chips to be tested by a thermal head. The thermal head capable of raising or lowering the temperature is designed to abut the chips to be tested so as to heat or cool the chips. Further, for example, Japanese Pat. Pub. No.: 5-121598 discloses heating or cooling directly the chips to be tested by temperature controlled fluids (high-temperature gases). Further, U.S. Pat. Pub. No.: 2014368999 discloses a combination of a thermal head and a temperature controlled test socket to provide a temperature controlled environment, that is, a test environment under high-temperature or low-temperature.

Nevertheless, in the prior art technique, in case of low-temperature test, as the temperature of the equipment and electronic components to be tested are well below the dew point temperature, once the equipment and the electronic components come into contact with the atmosphere, condensate tends to produce. The condensate produced may cause a short circuit that would damage the test equipment or the chips to be tested which are provided with complex circuits and electronic components thereon.

SUMMARY OF THE INVENTION

A main objective of the present invention is to provide a dew resistant module for a test socket, and an electronic component testing device having the same, which may prevent the production of condensate during the low-temperature test. Further, no matter a high-temperature or low-temperature test is conducted, the present invention may prevent heat dissipation of the temperature controlled parts under high or low-temperature due to contact with the atmosphere or other objects, and so will minimize energy loss.

In order to achieve the above objective, the present invention provides a dew resistant module for a test socket which is applicable to an electronic component testing device having a thermal head and a test socket. The thermal head is provided atop the test socket which comprises a chip slot for accommodating an electronic component. The thermal head is configured to control the temperature of the electronic component within the test socket.

The dew resistant module for a test socket according to the present invention primarily comprises an enclosure body, a test socket base plate and a cover. The enclosure body circumscribes the test socket. The test socket base plate is arranged on the test socket and the enclosure body. The test socket base plate comprises a through hole, and at least one dry air inlet which corresponds to the chip slot of the test socket. The cover at least partially covers the test socket, the enclosure body, and the test socket base plate. The cover includes an opening through which the thermal head passes to abut the electronic component on the test socket. The thermal head, the cover, the test socket base plate, and the chip slot of the test socket form an internal chamber. The dry air inlet of the test socket base plate is in communication with the internal chamber at one end and with the dry air supply source at the other end.

Accordingly, with the provision of the enclosure body and the cover, the present invention may effectively prevent the test socket, test socket base plate and a portion of the thermal head from coming into contact directly with the atmosphere, whereby condensation or dewing is prevented, thermal insulation achieved and energy loss minimized. In addition, the test socket base plate is provided with a dry air inlet for introducing the dry air. As such, dewing or condensation in the internal chamber and the electronic components contained therein are avoided.

Preferably, the enclosure body and the cover of the dew resistant module for a test socket according to the present invention are formed of a material having cushioning and thermal insulation properties, such as a foamed material. As such, the enclosure body and the cover not only may provide cushioning and thermal insulation, but also may withstand impact. When the thermal head abuts the electronic component on the test socket to regulate the temperature, the components will inevitably collide with each other. The enclosure body and cover that have cushioning properties can then absorb the impact, and effectively avoid the device and electronic components from being damaged by the collision. The enclosure body and the cover may be formed of rubber, phenol-formaldehyde resin, polystyrene resin, polyurethane resin, polyethylene resin or other equivalent materials.

In addition, the electronic component testing device according to the present invention may further include a circuit board on which the test socket may be provided, and the inner chamber may be formed by the thermal head, cover, test socket base plate, chip slot of the test socket, and the circuit board. Accordingly, the present invention can also effectively prevent the occurrence of condensation or dewing in the circuit board portion covered by the internal chamber.

The test socket base plate of the present invention may further include at least one dry air outlet having one open end in communication with the through hole, and one other open end provided on the outer peripheral wall of the test socket base plate. Accordingly, by the arrangement of the dry air passages, a flow field for the dry air in the internal chamber is established, so that the air having the moisture in the internal chamber may exit from the dry air outlet, and a dry air having improved dryness may enter through the dry air inlet. By this arrangement, the dew resistant effect can be further improved.

Preferably, the dry air supply source according to the present invention can supply cooled, low-temperature dry air or heated, high-temperature dry air to the at least one dry air inlet of the test socket base plate. In other words, the present invention not only provides the dew (condensation) resistant function, but also expedites the heating or cooling of the electronic component by using the dry air at high or low temperature, which will improve the test efficiency and reduce energy loss, and effectively maintain the temperature of the test environment in the internal chamber. A test environment under a constant temperature can thus be provided.

Further, the upper surface of the test socket base plate is provided with at least one guide post. The lower surface of the thermal head is provided with at least one guide hole to receive the at least one guide post. Accordingly, the test socket base plate of this invention also provides guiding effect to guide the thermal head to move smoothly and will not offset during the down press procedure.

To achieve the above objective, the present invention provides an electronic component testing device having a dew resistant module, which primarily comprises: a thermal head for regulating the temperature of an electronic component; a test socket having a chip slot for receiving the electronic component; an enclosure body circumscribing the test socket; a test socket base plate provided on top of the test socket and enclosure body, and having a through hole in alignment with the chip slot of the test socket; and a cover covering at least a portion of the test socket, the enclosure body and the test socket base plate; wherein the cover includes an opening through which the thermal head passes to abut the electronic component on the test socket.

Accordingly, by means of the arrangement of the enclosure body and the cover, the electronic component testing device having a dew resistant module of the present invention may prevent the test socket, test socket base plate and a portion of the thermal head from coming into contact directly with the atmosphere, whereby condensation or dewing is prevented, thermal insulation achieved and energy loss minimized.

Preferably, the test socket base plate of the electronic component testing device having a dew resistant module of the present invention may include at least one dry air inlet, and the thermal head, cover, test socket base plate, and the chip slot of the test socket form an internal chamber. The dry air inlet of the test socket base plate is in communication with the internal chamber at one end and with the dry air supply source at the other end. Accordingly, the test socket base plate of the present invention may further include a dry air inlet into which the dry air may be introduced. The dry air introduced may remove the moisture in the internal chamber, and thus condensation or dewing will not occur on the internal chamber and the electronic components contained therein.

Further, the test socket base plate of the electronic component testing device having a dew resistant module of the present invention may include at least one dry air outlet having one open end in communication with the through hole, and one other open end provided on the outer peripheral wall of the test socket. Accordingly, by means of the arrangement of the dry air passages, fresh dry gas having improved dryness may consistently flow into the internal chamber, while the wet air in the internal chamber may flow out from the dry air outlet, thereby enhancing the condensation or dewing resistant effect.

Further, the thermal head of the electronic component testing device having a dew resistant module of the present invention may include a contact portion and a heat exchange portion. When the thermal head is actuated to regulate the temperature of the electronic component in the test socket, the contact portion passes through the through hole of the test socket base plate and the opening of the cover to contact the electronic component. The heat exchange portion includes a fluid chamber for receiving a heat exchange fluid to make a circulation flow therein, and to make heat exchange with the contact portion. In other words, in the present invention, the heat exchange portion of the thermal head is filled with the cooled fluid from the cold source or the heated fluid from the heat source, so as to establish an uninterrupted replacement and circulation of flow to rapidly heat or cool the thermal head. In this way, the thermal head is maintained at a predetermined temperature which can be directly transmitted to the contact portion so as to control the temperature of the electronic components.

BRIEF DESCRIPTION OF THE DRAWINGS

The present invention will now be described with reference to the accompanying drawings illustrating preferred embodiments, in which.

DETAILED DESCRIPTION OF THE INVENTION

Figure 1:
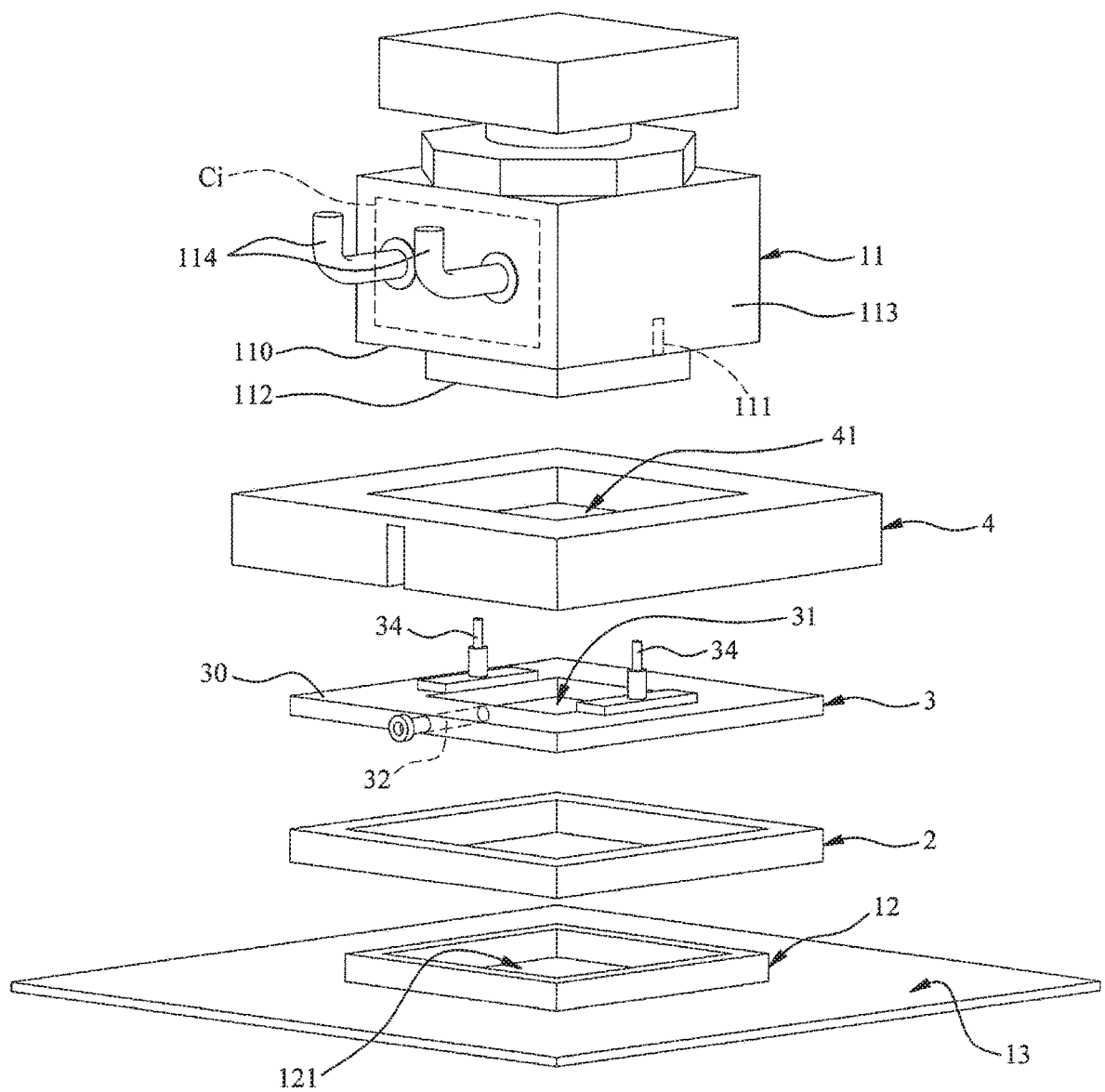
FIG. 1 shows an exploded view of the first embodiment according to the present invention.

Reference will now be made in detail to preferred embodiments of the present invention, as illustrated in the accompanying drawings, wherein like numerals indicate like parts. Furthermore, the accompanying drawings are illustrative only and are not necessarily to scale, and not all details are shown in the drawings.

Figure 2:
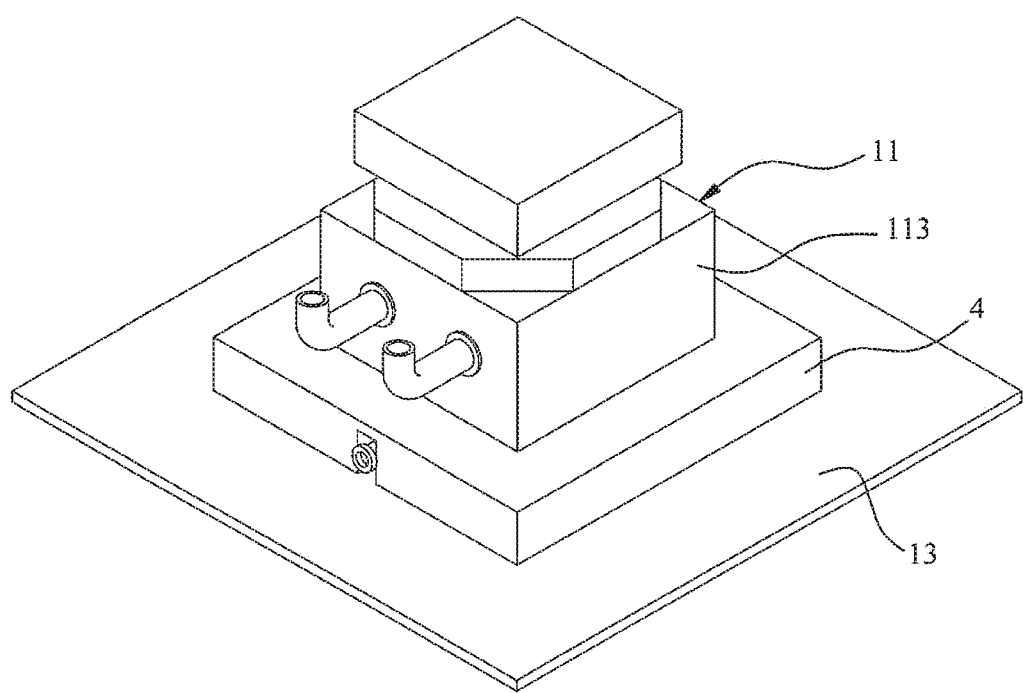
FIG. 2 shows a perspective view of the first embodiment under test.
Figure 3:
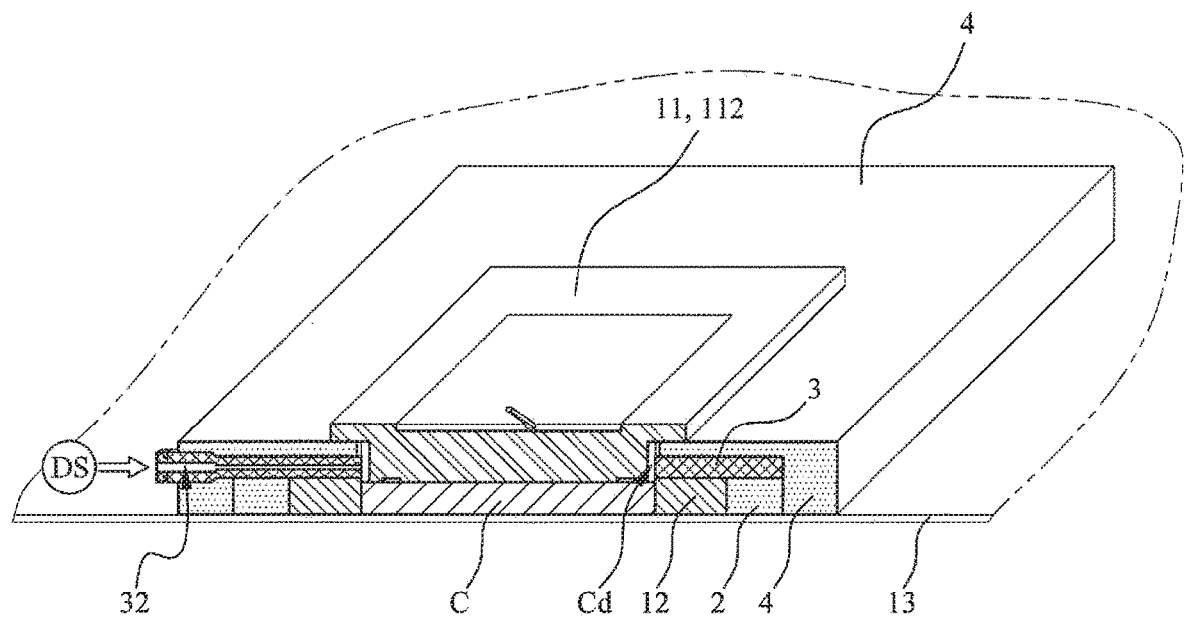
FIG. 3 shows a perspective view of a partial section of the first embodiment.

FIG. 1 is an exploded view of an electronic component testing device having a dew resistant module for a test socket according to a first preferred embodiment of the present invention. FIG. 2 shows a perspective view of the electronic component testing device having the dew resistant module for the test socket according to the first preferred embodiment under test. FIG. 3 shows a perspective view of a partial section of the first preferred embodiment.

As shown in the figures, the electronic component testing device according to the present invention primarily comprises a temperature controlled thermal head 11, a cover 4, a test socket base plate 3, a test socket 12, an enclosure body 2, and a circuit board 13. However, it is to be noted that the present invention is not limited to the above elements. Some other elements or modules, such as the pick-and-place module, the transfer module, or the controller for the electronic components, may also be applied in this embodiment.

The temperature controlled thermal head 11 shown in the figures includes a contact portion 112 and a heat exchange portion 113. The contact portion 112 is a heat conductive plate adapted to contact the electronic components for heating or cooling the electronic components. The contact portion 112 may be made of a material having a good thermal conductivity coefficient, such as copper or aluminum. The heat exchange portion 113 primarily includes a fluid chamber Ci and fluid passages 114 through which the temperature regulating fluid from the cold source or heat source (not shown) may continuously flow into or out of the fluid chamber Ci, so as to rapidly make heat exchange with the contact portion 112 to maintain the same at a predetermined temperature.

As the thermal head 11 makes use of a temperature regulating fluid that circulates constantly for heat exchanging, the temperature may be raised or lowered rapidly. For example, as soon as the heat source is switched to the cold source to regulate the temperature of the temperature regulating fluid, the original high-temperature test mode can be quickly changed to a low-temperature test mode. This means that the present invention can perform high and low temperature tests on the same electronic components under the same test procedure in the same testing device. At this time, as the device and the electronic components are subjected to three temperature stages: high temperature stage, low temperature stage and rewarming stage, condensation/dewing phenomenon would occur. This is one of the problems to be solved by the present invention.

As shown in the drawings, a circuit board 13 is provided below the thermal head 11. The circuit board 13 may include a circuit, contacts, or probes (not shown), and a test socket 12 for accommodating an electronic component C. In other words, when the test is carried out, the electronic component C is placed in the test socket 12, and the contacts or pins of the electronic component C electrically contact the probes or contacts of the circuit board 13 to facilitate detection. If there are condensates, the circuit, the contacts, or the probes of the circuit board 13 may short-circuit. This is also a problem to be solved by the present invention.

As shown in the drawings, the enclosure body 2 of this embodiment surrounds the outer circumference of the test socket 12, and is made of a foamed, thermal insulation material, for example, polystyrene resin. As such, the enclosure body 2 is provided with both cushioning and thermal insulation properties. In addition, the enclosure body 2 completely covers the outer peripheral surface of the test socket 12 to avoid contact with the atmosphere. Thus, the outer peripheral surface of the test socket 12 is prevented from coming into contact with the atmosphere, thereby avoiding the moisture in the atmosphere from condensing into water to form dew, and also providing thermal insulation and avoid heat dissipation.

The test socket base plate 3 is mounted atop the test socket 12 and enclosure body 2, and is provided with a through hole 31 and a dry air inlet 32. The through hole 31 corresponds to the chip slot 121 of the test socket 12. The dry air inlet 32 is in communication with the dry air supply source Ds at one end, and with the through hole 31 at the other end. The upper surface 30 of the test socket base plate 3 is provided with two guide posts 34 which correspond to the two guide holes 111 of the lower surface 110 of the thermal head 11. Accordingly, the test socket base plate 3 of this embodiment also provides guiding effect to guide the thermal head 11 to move smoothly and will not offset during the down press procedure.

With reference to the drawings, the cover 4 covers the test socket 12, the enclosure body 2, the test socket base plate 3, a portion of the circuit board 13, and a portion of the contact portion 112 of the thermal head 11. In this embodiment, the cover 4 is formed of the same material (foamed, thermal insulation material) as the enclosure body 2, and thus will also provide cushioning and thermal insulation functions. Further, when the thermal head 11 abuts the electronic component C on the test socket 12 to regulate the temperature, the components will collide with each other. The enclosure body 2 and cover 4 that have cushioning effect can then absorb the impact, and effectively avoid the device and electronic components from being damaged by the collision.

Since the cover 4 is also provided with thermal preservation and thermal insulation properties, it may prevent the heat from dissipating from the contact portion 112 of the thermal head 11, the test socket 12, and the electronic component C, thereby minimizing energy loss. Further, the cover 4 is provided with an opening 41 through which the thermal head 11 may pass to abut the electronic component C on the test socket 12.

As shown in FIGS. 1, 2 and 3, when the thermal head 11 is actuated to abut the electronic component C on the test socket 12 with the contact portion 112 to regulate the temperature, the contact portion 112 passes through the through hole 31 of the test socket base plate 3 and the opening 41 of the cover 4 to contact the electronic component C, and the thermal head 11, cover 4, test socket base plate 3, test socket 12, electronic component C and circuit board 13 together form an internal chamber Cd. The dry air from the dry air supply source Ds enters the internal chamber Cd through the dry air inlet 32 of the test socket base plate 3.

The internal chamber Cd forms a dry air barotropic zone as dry air is introduced thereinto. The electronic component C to be tested, and the test equipment covered by the internal chamber Cd are located within the barotropic zone. Therefore, the humid air in the atmosphere is prevented from coming into contact with the surfaces of the components at low temperature. Condensation or dewing will not happen. Moreover, although the internal chamber Cd is an enclosed space, there are still pores or clearances on the chamber. This design is intended to allow the dry air to escape from the chamber after the dry air enters the chamber.

In an alternative embodiment, the dry air supply source Ds can directly supply dry air at high or low temperature. In particular, the temperature of the dry air supplied by the dry air supply source Ds can be set according to the test conditions, and the dry air at a high or low temperature can be directly transferred into the internal chamber Cd, and thus a test environment under constant temperature may be established. In other words, the present invention not only provides the dew (condensation) resistant function, but also expedites the heating or cooling of the electronic component by using the dry air at high or low temperature, which will improve the test efficiency and reduce energy consumption, and effectively maintain the temperature of the test environment in the internal chamber.

The means for heating or cooling the dry air can be a temperature regulating device (not shown), for example, a high or low temperature heat sink. When the dry air flows through the high or low temperature heat sink, it will be heated or cooled to a predetermined test temperature. However, the present invention is not limited to this design, and other means for heating or cooling the dry air of the equivalent effects may also be used.

Figure 4:
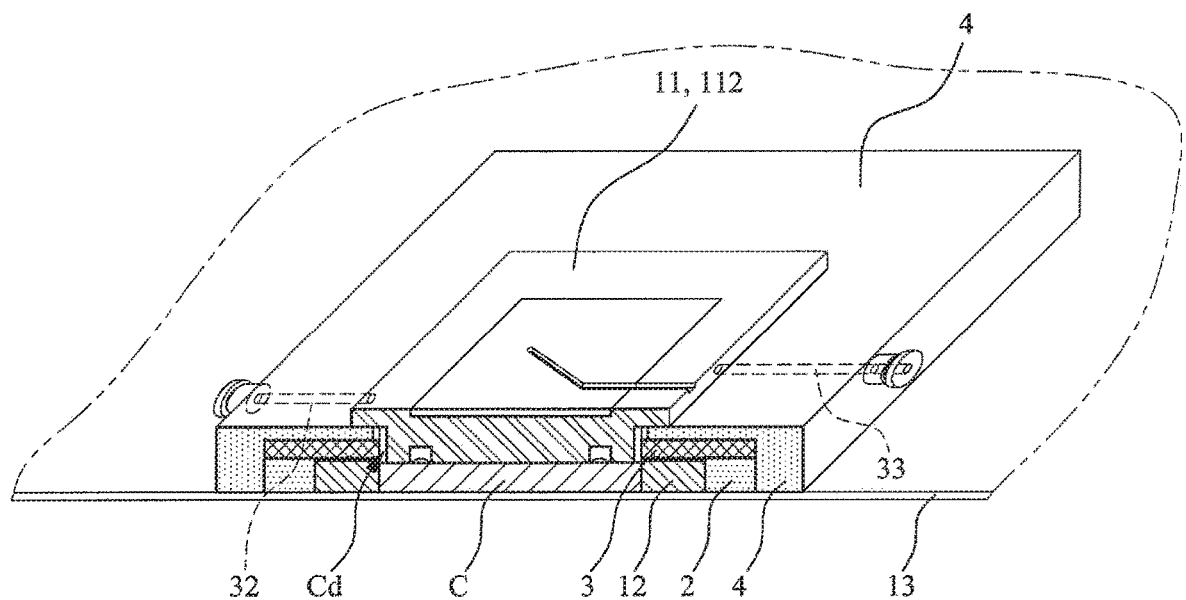
FIG. 4 shows a perspective view of a partial section of a second embodiment according to the invention.

FIG. 4 shows a perspective view of a partial section of a second embodiment of an electronic component testing device having a dew resistant module for the test socket. The second embodiment according to the present invention is primarily different from the first embodiment described hereinbefore in that the test socket base plate 3 of the second embodiment is further provided with a dry air outlet 33 having one open end in communication with the through hole 31, and one other open end provided on the outer peripheral wall of the test socket base plate 3. Accordingly, the dry air outlet 33 of the present embodiment may establish a flow field for the dry gas in the internal chamber Cd, so that the gas having the moisture in the internal chamber Cd may exit from the dry air outlet 33, and a dry gas having improved dryness may enter through the dry air inlet 32. By this arrangement, the dew resistant effect can be further improved.

Although in the present embodiment, only one dry air inlet 32 and one dry air outlet 33 are provided, the flow field may be designed to improve the dehumidifying effect by arranging the relative positions between the dry air inlet 32 and the dry air outlet 33, or alternatively, by increasing the quantity of the dry air inlet or outlet 32, 33. In addition, increasing the number of the dry air outlet 33 will reduce the system impedance of the chamber and increase the flow rate.

Although the foregoing has been described in terms of some preferred embodiments, those skilled in the art will recognize that the invention is not limited to the embodiments described. For example, the dry air passages (inlet and outlet) are not essential and necessary. In some other embodiments, the dry air inlet and outlet 32, 33 may be omitted. The test socket 3 may simply rely on the enclosure body 2 and the cover 4 to isolate the electronic component C and test device from the atmosphere, which may also obtain a good dew resistant effect. Therefore, the apparatus of the present invention can be practiced with modification and alteration within the spirit and scope of the appended claims. The description is thus to be regarded as illustrative instead of limiting the present invention.

The invention claimed is:

1. A dew resistant module for an electronic component testing device comprising a test socket and a thermal head provided on the test socket, the test socket having a chip slot for receiving an electronic component, the thermal head regulates the temperature of the electronic component disposed within the test socket, the module comprising:
   an enclosure body circumscribing the test socket;
   a test socket base plate provided on top of the test socket and the enclosure body, the test socket base plate having at least a dry air inlet and a through hole in alignment with the chip slot of the test socket; and
   a cover covering at least a portion of the test socket, the enclosure body and the test socket base plate; the cover having an opening through which the thermal head passes to abut the electronic component on the test socket;
   wherein the enclosure body and the cover are formed of a material having cushioning and thermal insulation properties; wherein the thermal head, the cover, the test socket base plate, and the chip slot of the test socket form an internal chamber, and the dry air inlet of the test socket base plate is in communication with the internal chamber at one end and with a dry air supply source at the other end.

2. The dew resistant module according to claim 1, wherein the enclosure body and the cover are formed of at least a material selected from the group consisting of rubber, phenol-formaldehyde resin, polystyrene resin, polyurethane resin and polyethylene resin.

3. The dew resistant module according to claim 1, wherein the electronic component testing device further comprises a circuit board on which the test socket is disposed, the internal chamber is confined by the thermal head, the cover, the test socket base plate, the chip slot of the test socket, and the circuit board.

4. The dew resistant module according to claim 1, wherein the test socket base plate is provided with at least one dry air outlet having one open end in communication with the through hole, and one other open end provided on the outer peripheral wall of the test socket base plate.

5. The dew resistant module according to claim 1, wherein the dry air supply source transfers the cooled, low-temperature dry air or the heated, high-temperature dry air to the at least one dry air inlet of the test socket base plate.

6. An electronic component testing device having a dew resistant module, comprising:
   a thermal head for regulating a temperature of an electronic component;
   a test socket having a chip slot for receiving the electronic component;
   an enclosure body circumscribing the test socket;
   a test socket base plate provided on top of the test socket and the enclosure body; the test socket base plate having a through hole in alignment with the chip slot of the test socket; and
   a cover covering at least a portion of the test socket, the enclosure body and the test socket base plate; the cover having an opening through which the thermal head passes to abut the electronic component on the test socket;
   wherein the enclosure body and the cover are formed of a material having cushioning and thermal insulation properties.

7. The electronic component testing device according to claim 6, wherein the test socket base plate having at least a dry air inlet, the thermal head, the cover, the test socket base plate, and the chip slot of the test socket form an internal chamber, and the dry air inlet of the test socket base plate is in communication with the internal chamber at one end and with a dry air supply source at the other end.

8. The electronic component testing device according to claim 7, wherein the test socket base plate is provided with at least one dry air outlet having one open end in communication with the through hole, and one other open end provided on the outer peripheral wall of the test socket base plate.

9. The electronic component testing device according to claim 6, wherein the thermal head comprises a contact portion and a heat exchange portion, when the thermal head is actuated to regulate the temperature of the electronic component in the test socket, the contact portion passes through the through hole of the test socket base plate and the opening of the cover to contact the electronic component, the heat exchange portion includes a fluid chamber for receiving a heat exchange fluid to make a circulation flow therein, and to make heat exchange with the contact portion.

* * * * *